(12) United States Patent
Venikar et al.

(10) Patent No.: US 12,320,863 B2
(45) Date of Patent: Jun. 3, 2025

(54) APPARATUS, METHODS AND COMPUTER-READABLE MEDIA FOR DETECTION OF LOOSE CONNECTIONS IN AN ELECTRICAL ASSEMBLY

(71) Applicant: Eaton Intelligent Power Limited, Dublin (IE)

(72) Inventors: Prasad Arvind Venikar, Pune (IN); Rajasekhar Navara, Pune (IN); Yogesh Rajwade, Pune (IN); Santosh Kumar Sharma, Pune (IN); Eddie Wilkie, Fletcher, NC (US); David Glenn Loucks, Coraopolis, PA (US)

(73) Assignee: Eaton Intelligent Power Limited, Dublin (IE)

( * ) Notice: Subject to any disclaimer, the term of this patent is extended or adjusted under 35 U.S.C. 154(b) by 625 days.

(21) Appl. No.: 17/362,396

(22) Filed: Jun. 29, 2021

(65) Prior Publication Data

US 2022/0413063 A1     Dec. 29, 2022

(51) Int. Cl.
  *G01R 31/54*   (2020.01)
  *G01R 31/08*   (2020.01)
(52) U.S. Cl.
  CPC ........... *G01R 31/54* (2020.01); *G01R 31/083* (2013.01); *G01R 31/088* (2013.01)
(58) Field of Classification Search
  USPC ....................................................... 324/700
  See application file for complete search history.

(56) References Cited

U.S. PATENT DOCUMENTS 7,812,615 B2 * 10/2010 Gajic ..................... H02H 7/045
                                                                361/76
10,145,897 B2 * 12/2018 Fedigan ............... G01R 31/346

FOREIGN PATENT DOCUMENTS

CN         109507530         3/2019

OTHER PUBLICATIONS

Jangho Yun et al: "Online Detection of High-Resistance Connections in the Incoming Electrical Circuit for Induction Motors," IEEE Transactions on Industry Applications, US, vol. 45, No. 2, Mar. 2009; pp. 694-702.

(Continued)

*Primary Examiner* — Farhana A Hoque
(74) *Attorney, Agent, or Firm* — Stanek Lemon Crouse & Meeks, PA

(57) ABSTRACT

Voltage samples are collected for a source and loads connected thereto by an electrical network. Respective negative sequence voltage difference values are generated for respective source/load pairs from the voltage sample. A connection (e.g., a loose connection) in the electrical network is identified based on the generated negative sequence voltage difference values. The identified connection is reported to a user. Identifying a connection in the electrical network may include identifying at least one source/load pair having an associated negative sequence voltage difference value that meets a predetermined criterion and identifying the connection based on the identified at least one source/load pair. Identifying the connection may include identifying at least one source/load pair having an associated negative sequence voltage difference value with a magnitude falling outside of at least one range associated with the at least one source/load pair.

17 Claims, 11 Drawing Sheets

(56) References Cited

OTHER PUBLICATIONS

Colby, R.S.: "Detection of high-resistance motor connections using symmetrical component analysis and neural network models", Diagnostics for Electric Machines, Power Electronics and Drives, (2003) SDEMPED 2003, 4th IEEE Int'l. Symposium on Aug. 24-26, 2003, pp. 2-6.
International Searching Authority, International Search Report and Written Opinion for International Application No. PCT/IB2022/057495, dated Nov. 16, 2022, 13 pages.
International Preliminary Report on Patentability for International Application No. PCT/IB2022/057495, dated Jan. 11, 2024, 9 pages.

* cited by examiner

APPARATUS, METHODS AND COMPUTER-READABLE MEDIA FOR DETECTION OF LOOSE CONNECTIONS IN AN ELECTRICAL ASSEMBLY

BACKGROUND

Electrical apparatus, such as motor control centers and switchgear, often include extensive and complex bus bar arrangements with connections at multiple locations. Vibrations and improper maintenance can loosen these connections and lead to localized heating. If such hotspots are not detected in a timely manner, thermal failure can occur during routine operation or during a heavy external fault. Such thermal failure can result in injury to personnel and damage to equipment.

Several techniques have been proposed for monitoring and detecting such conditions. Many of these conventional approaches use temperature sensors at multiple locations to monitor connection temperatures. However, it may be difficult to place sensors and associated hardware near connection and such an approach can be expensive considering the number of sensors that may be needed and the associated cost of hardware for interfacing the sensors.

SUMMARY

Some embodiments provide methods of monitoring an electrical network coupling a source to a plurality of loads to identify, for example, loose connections. The methods include collecting voltage samples for the source and the loads, generating respective negative sequence voltage difference values for respective source/load pairs from the voltage sample, identifying a connection in the electrical network based on the generated negative sequence voltage difference values, and reporting the identified connection to a user. Identifying a connection in the electrical network based on the generated negative sequence voltage difference values may include identifying at least one source/load pair having an associated negative sequence voltage difference value that meets a predetermined criterion and identifying the connection based on the identified at least one source/load pair. Identifying the connection may include identifying at least one source/load pair having an associated negative sequence voltage difference value with a magnitude falling outside of at least one range associated with the at least one source/load pair.

In some embodiments, generating respective negative sequence voltage difference values may be preceded by determining respective ranges for negative sequence voltage difference values for the respective source/load pairs. Determining respective ranges for negative sequence voltage difference values for respective source/load pairs from the voltage may include generating respective negative sequence voltage difference values from voltage samples for a calibration interval and determining respective ones of the ranges from the negative sequence voltage difference values for the calibration interval.

According to some embodiments, generating respective negative sequence voltage difference values for respective source/load pairs from the voltage samples may include generating respective negative sequence voltage values for the source and the loads from the voltage samples and generating the respective negative sequence voltage difference values for the respective source/load pairs from the negative sequence voltage values. Generating the respective negative sequence voltage difference values for the respective source/load pairs from the negative sequence voltage values may include normalizing the negative sequence voltage values and generating the respective negative sequence voltage difference values for the respective source/load pairs from the normalized negative sequence voltage values. Generating respective negative sequence voltage values for the source and the loads from the voltage samples may include averaging the voltage samples to generate average voltage values and generating the respective negative sequence voltage values for the source and the loads from the average voltage values.

Averaging the voltage samples to generate average voltage values may include converting the voltage samples to rectangular coordinate voltage values, summing the rectangular coordinate values to generate respective sums for respective collection intervals, and dividing a sum of the sums by a number of sampling intervals in the collection intervals to generate an average voltage value.

Further embodiments provide a system for monitoring an electrical network coupling a source to a plurality of loads. The system includes respective voltage sensing circuits configured to collect voltage samples for respective ones of the source and the loads. The system further includes a monitor circuit configured to receive the voltage samples, to generate respective negative sequence voltage difference values for respective source/load pairs from the voltage samples, to identify a connection in the electrical network based on the negative sequence voltage difference values, and to report the identified connection to a user.

In some embodiments, the monitor circuit may be configured to identify at least one source/load pair having an associated negative sequence voltage difference value that meets a predetermined criterion and to identify the connection based on the identified at least one source/load pair. The monitor circuit may be configured to identify at least one source/load pair having an associated negative sequence voltage difference value with a magnitude falling outside of at least one range associated with the at least one source/load pair.

In some embodiments, the monitor circuit may be configured to determine respective ranges for negative sequence voltage difference values for the respective source/load pairs. The monitor circuit may be configured to generate respective negative sequence voltage difference values from voltage samples for a calibration interval and to determine respective ones of the ranges from the negative sequence voltage difference values for the calibration interval.

According to some embodiments, the monitor circuit may be configured to generate respective negative sequence voltage values for the source and the loads from the voltage samples and to generate the respective negative sequence voltage difference values for the respective source/load pairs from the negative sequence voltage values. The monitor circuit may be configured to normalize the negative sequence voltage values and to generate the respective negative sequence voltage difference values for the respective source/load pairs from the normalized negative sequence voltage values. The monitor circuit may be configured to average the voltage samples to generate average voltage values and to generate the respective negative sequence voltage values for the source and the loads from the average voltage values. The monitor circuit may be configured to convert the voltage samples to rectangular coordinate voltage values, to sum the rectangular coordinate values to generate respective sums for respective collection intervals, and to divide a sum of the sums by a number of sampling intervals in the collection intervals to generate an average voltage value.

In some embodiments, the monitor circuit may include a processor circuit configured to execute a connection monitor application configured to generate the respective negative sequence voltage difference values for the respective source/load pairs from the voltage samples, to identify the connection in the electrical network based on the generated negative sequence voltage difference values, and to report the identified connection to the user.

DETAILED DESCRIPTION

Figure 1:
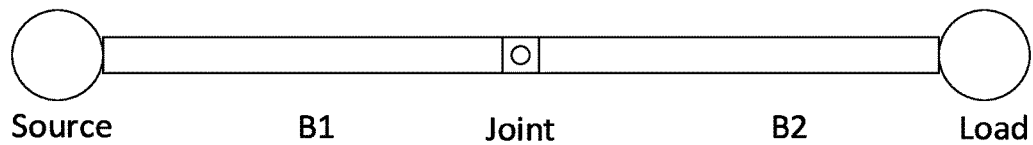
FIG. 1 illustrates an example bus bar arrangement.

The inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Example embodiments are described herein with reference to block diagrams and/or flowchart illustrations of methods, devices, systems and/or non-transitory computer-readable media configured to execute on a data processing apparatus. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a tangible or non-transitory computer-readable storage medium that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-readable storage medium having program code embodied in the non-transitory medium for use by or in connection with an instruction execution system. In the context of this document, a computer-readable medium may be any tangible, non-transitory medium that can contain, store, communicate, propagate, or transport the program for use by or in connection with the instruction execution system, apparatus, or device.

The computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), and a portable compact disc read-only memory (CD-ROM).

The terms "tangible" and "non-transitory." as used herein, are intended to describe a computer-readable storage medium (or "memory") excluding propagating electromagnetic signals but are not intended to otherwise limit the type of physical computer-readable storage device that is encompassed by the phrase computer-readable medium or memory. For instance, the terms "non-transitory computer-readable medium" or "tangible memory" are intended to encompass types of storage devices that do not necessarily store information permanently, including for example, random access memory (RAM).

Some embodiments provide systems, methods, and computer-readable media for monitoring connections in electrical assemblies, such as motor control centers and switchgear, using negative sequence voltage measurements. These voltage measurements can be from voltage sensors that are used in the control and operation of components of the assembly, thus reducing or eliminating the need for additional sensors for the connection detection process, unlike the special-purpose temperature sensors that may be used in some conventional approaches. In some embodiments, voltage measurements for different source-load combinations may be oversampled over predefined time interval. The sampled data may be processed using a negative sequence component deconstruction and a topology-guided lookup process to detect loose connections. This can support condition-based preventive maintenance practice. Further embodiments can provide techniques for reducing memory requirements for data used in the detection process.

Figure 2:
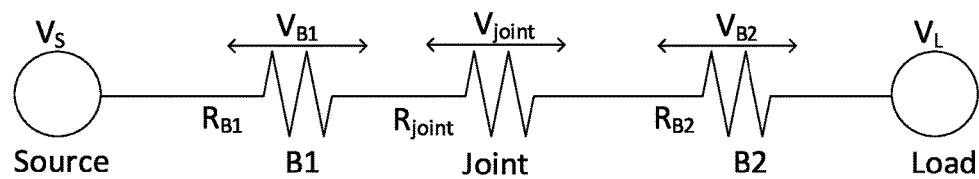
FIG. 2 is a schematic diagram illustrating an equivalent circuit model of the bus bar arrangement of FIG. 1.

Consider a 2-bus bar connection with source at one end and load at the other as shown in FIG. 1. An electrical equivalent representing the bus bar impedance for FIG. 1 is shown in FIG. 2. Referring to FIG. 2, voltage equations can be written as:

$$\overline{V}_S = \overline{V}_L + \overline{V}_{B1} + \overline{V}_{B2} + \overline{V}_{joint}, \quad (1)$$

where $\overline{V}_S$=three phase source voltage, $\overline{V}_L$=three phase load voltage, and $\overline{V}_{B1}$, $\overline{V}_{B2}$, $\overline{V}_{joint}$=voltage drops across bus bar 1, bus bar 2 and the connection, respectively. Based on initial measurements for duty cycle of the assembly, $\overline{V}_S$ and $\overline{V}_L$ can be measured and the overall voltage drop $\overline{V}_{Assembly}$ across the assembly can be estimated:

$$\overline{V}_{Assembly} = \overline{V}_{B1} + \overline{V}_{B2} + \overline{V}_{joint}. \quad (2)$$

Therefore:

$$\overline{V}_S = \overline{V}_L + \overline{V}_{Assembly}. \quad (3)$$

To compute negative sequence components, pre-multiply (3) by ⅓ [A], where [A]=[1 a² a], and a=1∠120°:

$$\frac{1}{3}[A]\overline{V}_S = \frac{1}{3}[A]\overline{V}_L + \frac{1}{3}[A]\overline{V}_{Assembly}, \quad (4)$$

$$\frac{1}{3}[1 \ a^2 \ a]\begin{bmatrix}V_{SA}\\V_{SB}\\V_{SC}\end{bmatrix} = \frac{1}{3}[1 \ a^2 \ a]\begin{bmatrix}V_{LA}\\V_{LB}\\V_{LC}\end{bmatrix} + \frac{1}{3}[1 \ a^2 \ a]\begin{bmatrix}V_{AssemblyA}\\V_{AssemblyB}\\V_{AssemblyC}\end{bmatrix}, \text{ and}$$

$$\overline{V}_{S2} - \overline{V}_{L2} = \overline{V}_{Assembly2},$$

where $\overline{V}_{S2}$, $\overline{V}_{L2}$, $\overline{V}_{Assembly2}$=the negative sequence component of the source voltage, the negative sequence component of the load voltage and the negative sequence component of the assembly voltage drop, respectively.

Initial measurements can be used to determine $\overline{V}_{S2}$ and $\overline{V}_{L2}$ and estimate the voltage difference $\overline{V}_{Assembly2}$ to establish a base value that accounts for the inherent unbalance in the assembly structure for all the three phases under normal conditions. Any further unbalance in the voltage difference $\overline{V}_{Assemby2}$ may be due to additional asymmetry introduced by a loosened connection. Therefore, $\overline{V}_{Assembly2\_reference}$ may be initially established in a calibration mode when the connection is in a healthy condition. Subsequently, in a monitoring mode, voltage differences $\overline{V}_{Assembly2\_calculated}$ may be generated from iterative measurements and compared with $\overline{V}_{Assembly2\_reference}$ to identify additional unbalance.

For a healthy connection condition, $$Mag(\overline{V}_{Assembly2\_calculated} - \overline{V}_{Assembly2\_reference}) \cong 0 \quad (5)$$

Here, normalization can be performed. For normalization, a positive sequence component of the current measurements may be used to determine a scaling for the negative sequence voltage delta to rated load as base condition.

Figure 3:
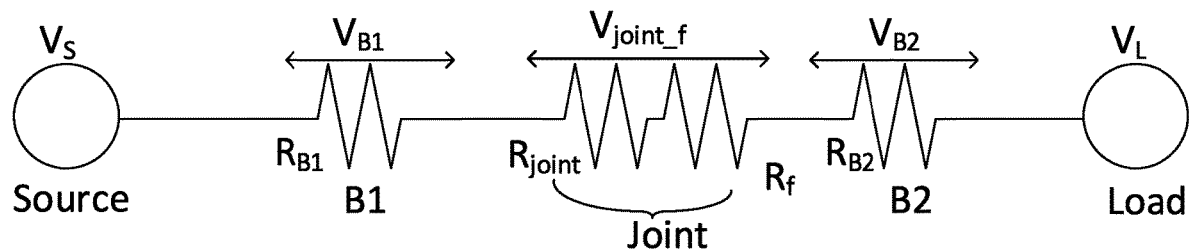
FIG. 3 is a schematic diagram illustrating an equivalent circuit mode of the bus bar arrangement of FIG. 1 with a loosened connection.

A loose connection in bus bar results in an increase in contact resistance. Using the structure from FIG. 1, for a loose connection, the electrical equivalent is shown in FIG. 3. For a faulty (loose) connection condition:

$$\overline{V}_S = \overline{V}_L + \overline{V}_{B1} + \overline{V}_{B2} + \overline{V}_{joint\_f} \quad (6)$$

For the faulty connection condition:

$$R_{joint\_f} = R_{joint} + R_f$$

Therefore:

$$IR_{joint\_f} = IR_{joint} + IR_f$$

$$\overline{V}_{joint\_f} = \overline{V}_{joint} + \overline{V}_f.$$

Substituting into (6):

$$V_S = V_L + V_{B1} + V_{B2} + V_{joint} + V_f, \text{ and} \quad (7)$$

$$V_S = V_L + V_{Assembly} + V_f \quad (8)$$

Computing the negative sequence for (7):

$$V_{S2} - V_{L2} = V_{Assembly2} + V_{f2}. \quad (9)$$

Comparing (4) and (9) gives an additional component of voltage drop due to unbalance in impedance resulting from a loose connection. For the faulty connection condition:

$$Mag(V_{Assembly2\_calculated} - V_{Assembly2\_reference}) = V_f \neq 0 \quad (10)$$

Similar to the healthy connection condition, voltage data can be normalized using positive sequence components of current measurements.

Figure 4:
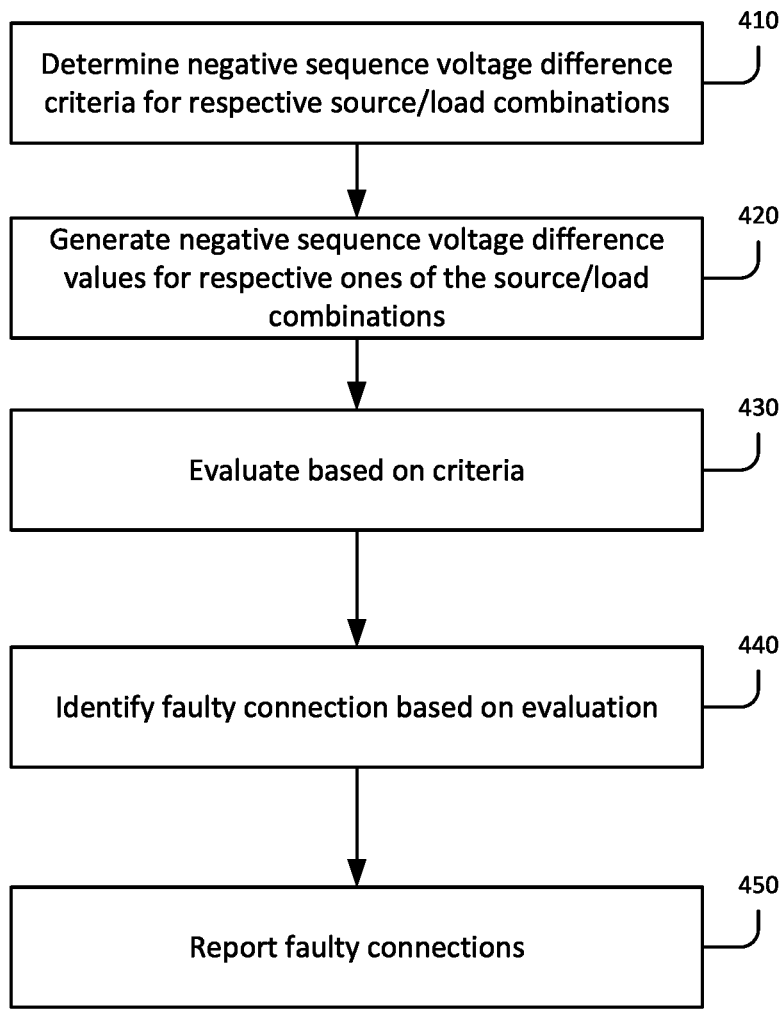
FIG. 4 is a flowchart illustrating operations for electrical connection monitoring according to some embodiments.

FIG. 4 is a flowchart illustrating operations for monitoring connections in an electrical assembly according to some embodiments. Negative sequence voltage difference criteria are determined for respective source/load pairs (block 410). Subsequently, negative sequence voltage difference values are generated for the respective source/load pairs (block 420). These negative sequence voltage difference values are evaluated based on the negative sequence voltage difference criteria (block 430) and, responsive to the evaluation, a faulty connection is identified (block 440). The identified faulty connection is reported (block 450) to, for example, trigger maintenance operations, such as tightening or replacement. For example, the faulty connection may be reported to a human user via a user interface device (e.g., a display or messaging device) and/or to an automated recipient, such as an automated maintenance system that, for example, generates maintenance orders. Such information could also be reported to protective systems, such as systems that automatically alter system operations (e.g., de-energize particular power distribution networks) when a loose connection is detected to prevent conditions that could endanger personnel or equipment.

Figure 5:
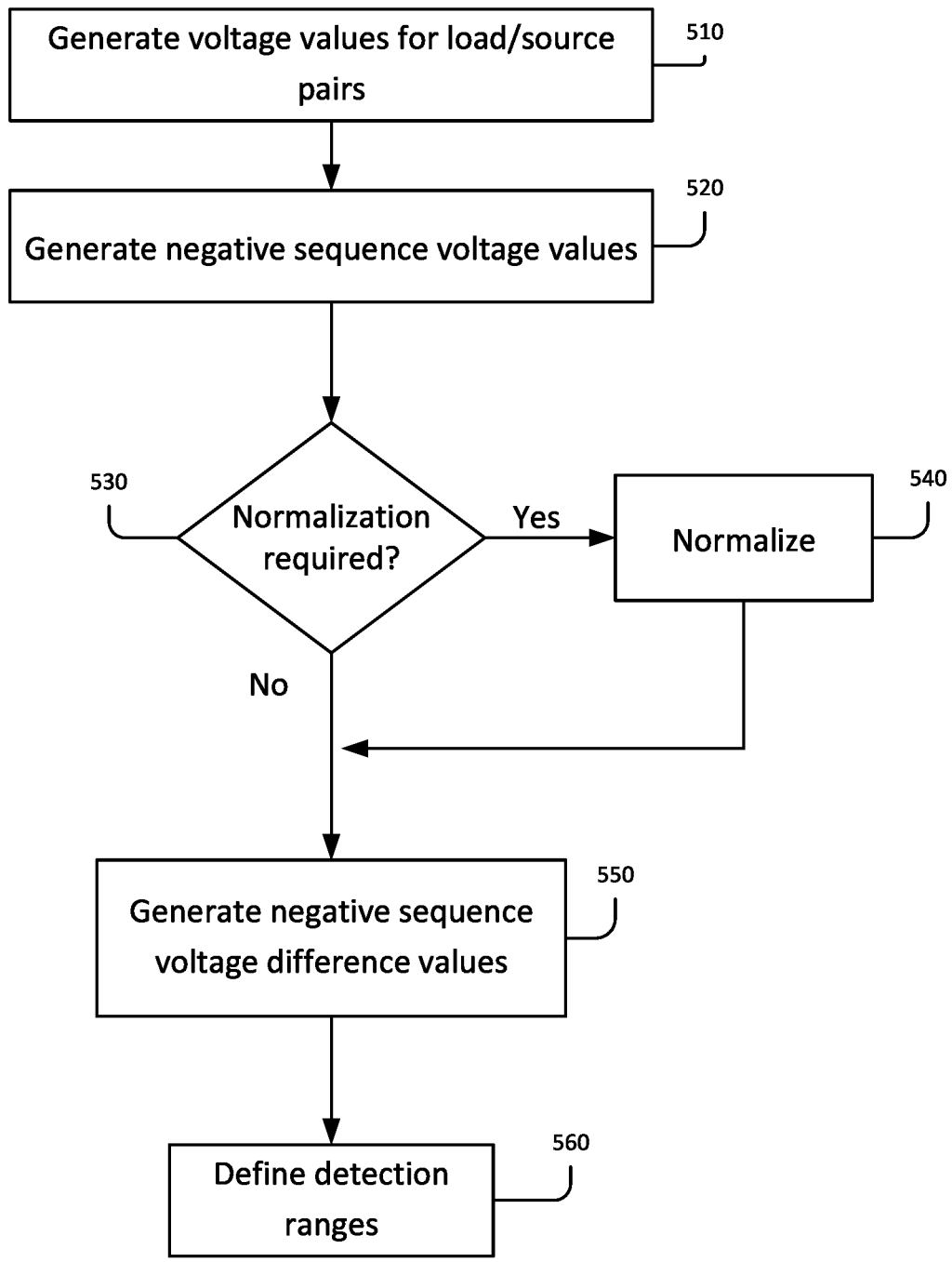
FIG. 5 is a flowchart illustrating operations for determining faulty connection criteria according to some embodiments.
Figure 6:
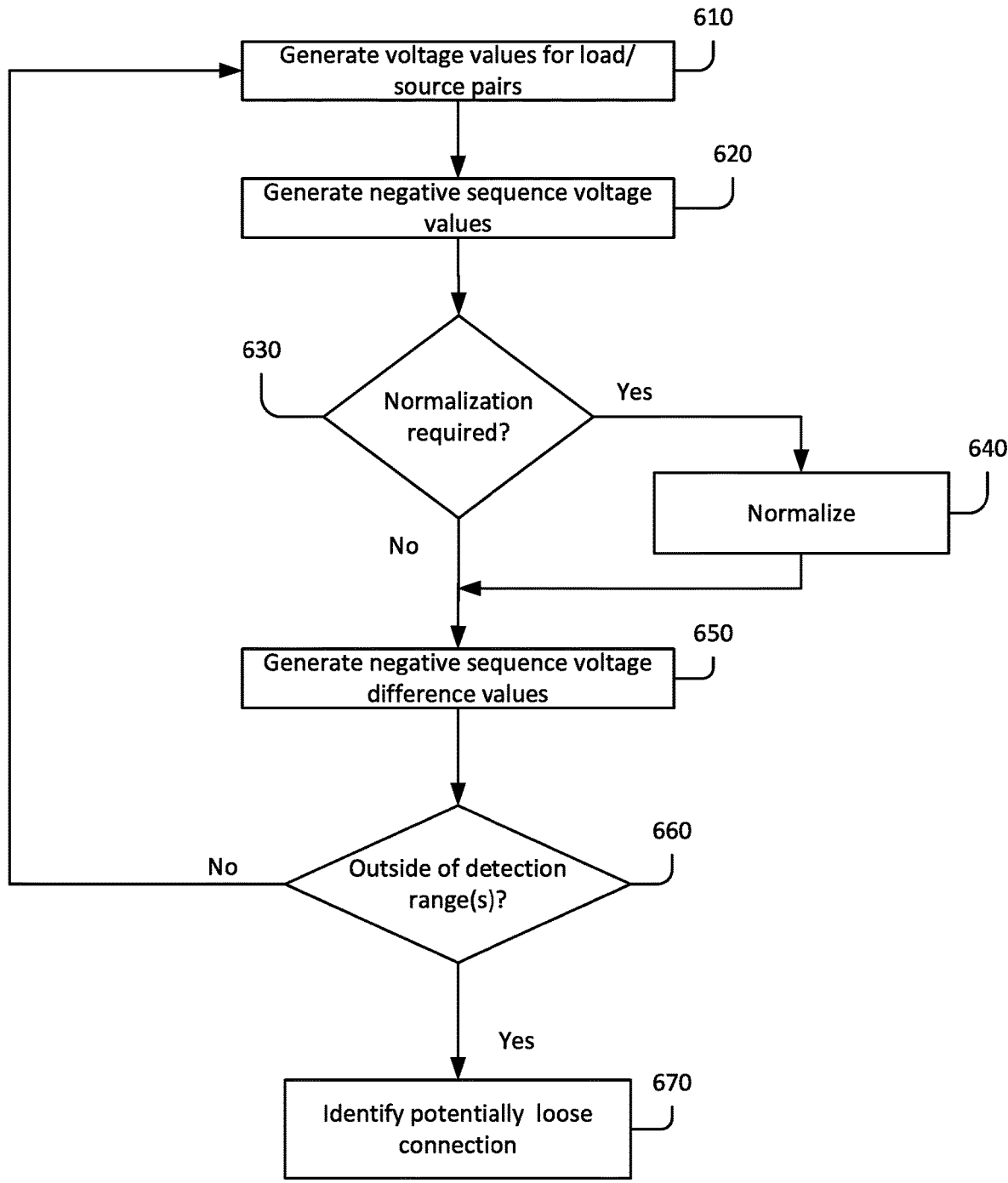
FIG. 6 is a flowchart illustrating operations for faulty connection detection according to further embodiments.

FIGS. 5 and 6 are flowcharts illustrating operations for detecting faulty connections according to further aspects. Generally, operations may be broken down into three categories: (1) as calibration mode in which negative sequence voltage ranges for detection of faulty connections may be defined; (2) a monitoring mode in which source and load voltages are monitored to detect excursions outside of these ranges that may be indicative of a faulty connection; and (3) a localization mode in which a particular faulty connection is identified.

Referring to FIG. 5, the calibration mode includes generating voltage samples for load/source pairs (block 510). This may involve, for example, oversampling and generating moving average values for the sampled voltages to filter noise in the voltage samples. Negative sequence voltage values are generated from the voltage samples, e.g., from the average values for the sampled voltages (block 520). If the negative sequence voltage values require normalization, they may be normalized based on, for example, corresponding current values (blocks 530, 540). Negative sequence voltage difference values for the respective source/load pairs are then generated from the normalized or non-normalized negative sequence voltage values (block 550). Detection ranges for the respective source/load pair are defined based on the negative sequence voltage difference values (block 560).

For example, the operations of generating source and load voltage values (block 510), generating negative sequence voltage values (block 520) and generating negative sequence voltage difference values (block 550) may be iteratively performed over a predefined interval to generate n data sets of negative sequence voltage difference values for each of the source/load pairs. Minimum and maximum negative sequence voltage difference values may be identified for each of the source/load pairs from the n data sets for the respective source/load pairs, and minimum and maximum thresholds for respective detection ranges for the respective source/load pairs may be defined based on the minimum and maximum negative sequence voltage difference values. For example, the thresholds may correspond to the maximum and minimum negative sequence voltage difference values plus or minus a tolerance.

Referring to FIG. 6, similar to the reference generation mode, the monitoring mode includes generating samples of voltages for source/load pairs (block 610). Negative sequence voltage values are generated (block 630). If the negative sequence voltage values require normalization, they may be normalized based on, for example, corresponding current values (block 640). Negative sequence voltage difference values are generated from the normalized or non-normalized negative sequence voltage values (block 650). One or more negative sequence voltage difference values for one or more of the source/load pairs moving outside of the detection range(s) for the source/load pair(s) may indicate presence of a faulty connection, which may be identified based on which source/load pair(s) is involved (blocks 660, 670). If this detection criterion is not met, voltage value generation (block 610), negative sequence voltage value generation (block 620) and generation of negative sequence voltage difference values (block 650) are performed in an iterative fashion as monitoring continues.

Figure 7:
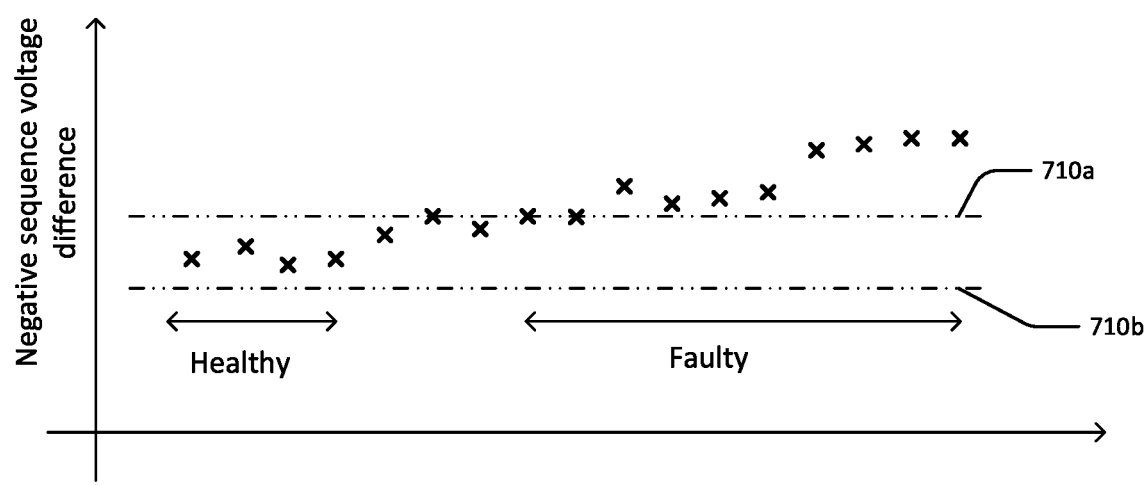
FIG. 7 is a graph illustrating application of a faulty connection criterion according to some embodiments.

FIG. 7 illustrates an example of a trend in negative sequence voltage difference values for a given source/load pair over time. As long as the negative sequence voltage difference values stay within the range defined by thresholds 710a, 710b, the negative sequence voltage difference values may be interpreted as indicating an acceptable connection condition.

However, once the values have sufficiently trended outside of this range, this may indicate the presence of an undesirably loose connection. To filter out noise and aberrant data, the negative sequence voltage difference values may be filtered such that, for example, moving averages generated from the negative voltage difference values may be compared to the detection threshold. The loose connection detection criterion may also involve, for example, determining whether the trend of the negative sequence voltage difference values outside of the predefined range is sufficiently persistent, e.g., one or more potential loose connection may be indicated if the negative sequence voltage difference values for one or more source/load pairs have fallen outside of the associated range(s) for m out of n values.

Figure 8:
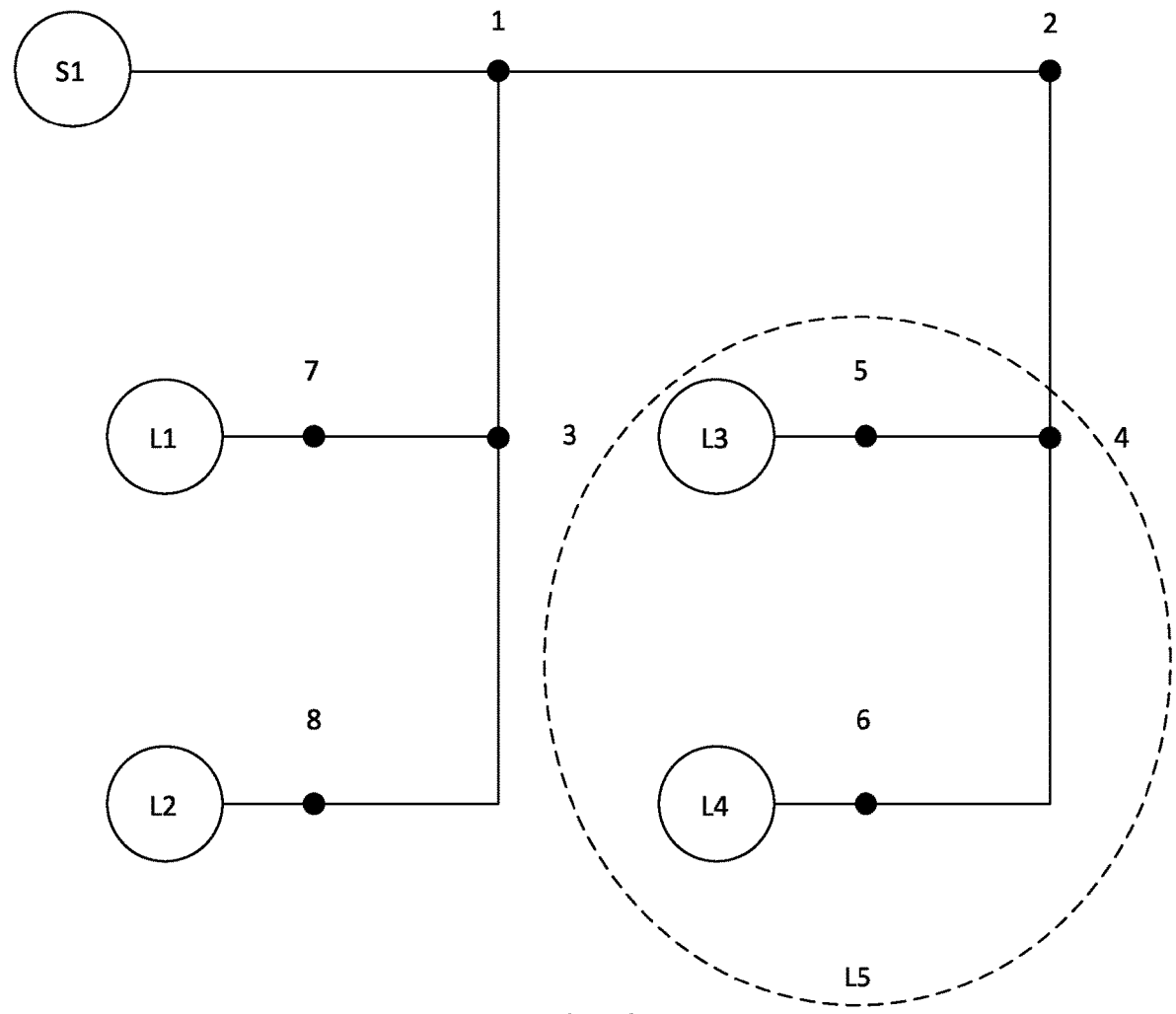
FIG. 8 is a schematic diagram of an example of an electrical assembly in which connection monitoring may be implemented according to some embodiments.

Once the presence of one or more loose connections has been detected, localization of the likely loose connection may be achieved using topological information about the assembly. For example, FIG. 8 illustrates an example assembly including a source S1 and loads L1, L2, L3 and L4 connected to the source by a bus bar assembly including joints 1, 2, 3, 4, 5, 6, 7, and 8. A lookup table as shown in Table 1 reflects this topology:

TABLE 1

| Joint | Source/Load Pair(s) |
|---|---|
| 1 | (S1, L1), (S1, L2), (S1, L3), (S1, L4) |
| 2 | (S1, L3), (S1, L4) |
| 3 | (S1, L1), (S1, L2) |
| 4 | (S1, L3), (S1, L4) |
| 5 | (S1, L3) |
| 6 | (S1, L4) |
| 7 | (S1, L1) |
| 8 | (S1, L2) |

Such a lookup table may be referenced based on identification of which source/load pairs have negative sequence voltage difference values that trend out of a predefined detection range, such that one or more potentially loose joints may be identified.

Figure 9A:
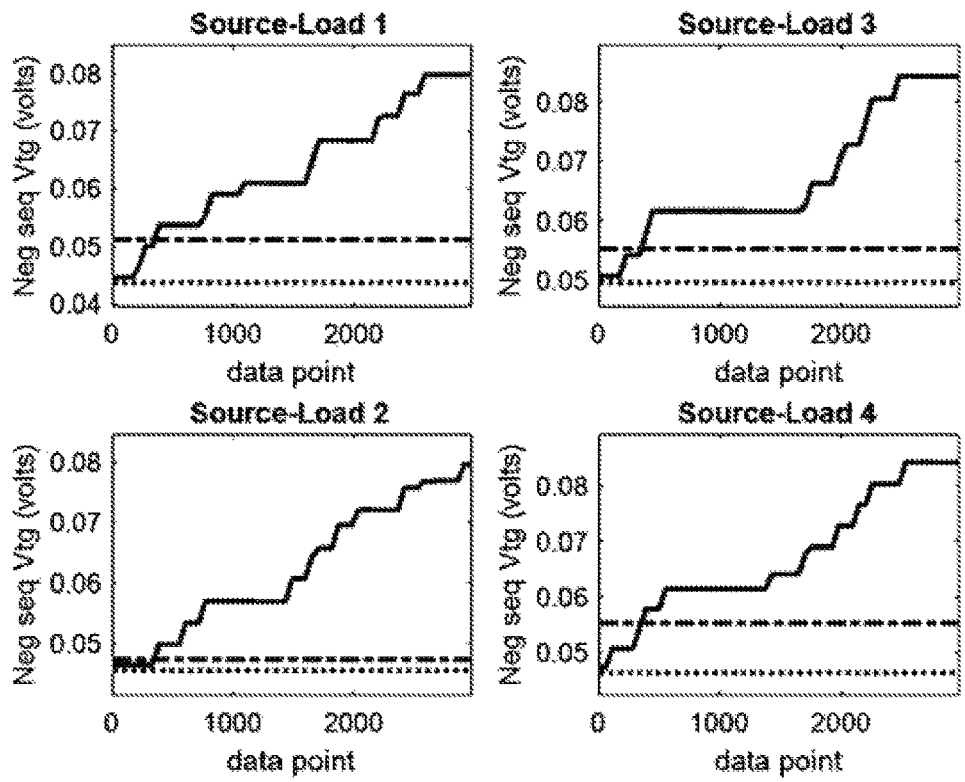
FIGS. 9A and 9B illustrate simulated negative sequence voltage difference variations for source/load combinations of the electrical assembly of FIG. 7 and corresponding fault status for connections of the electrical assembly of FIG. 7, respectively, for a first connection fault.
Figure 9B:
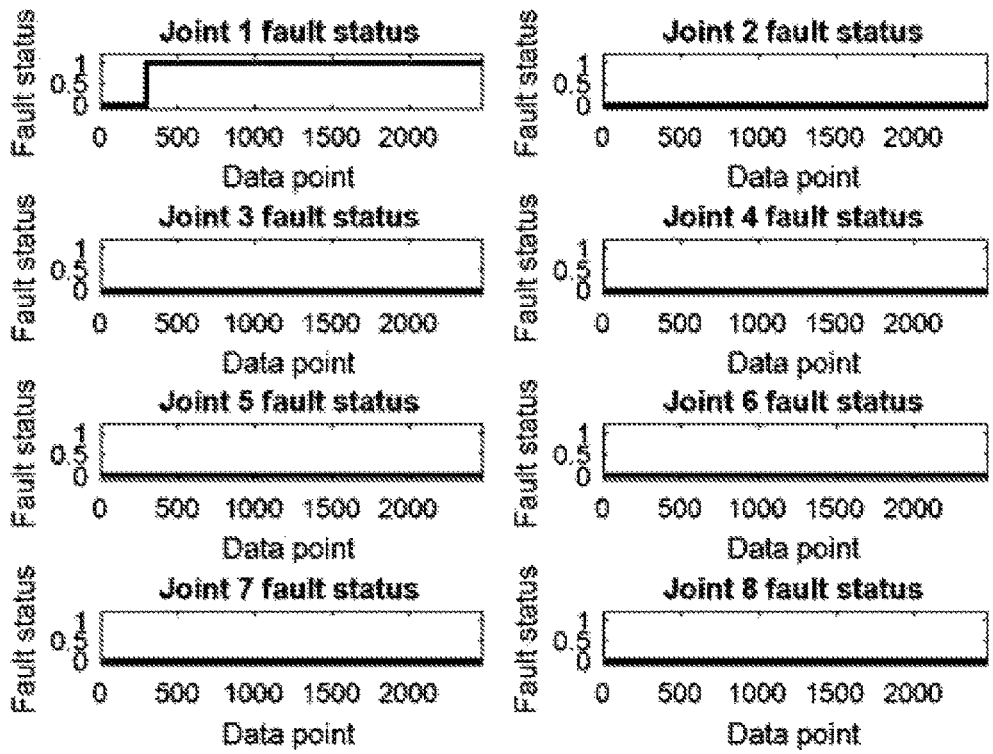
Figure 10A:
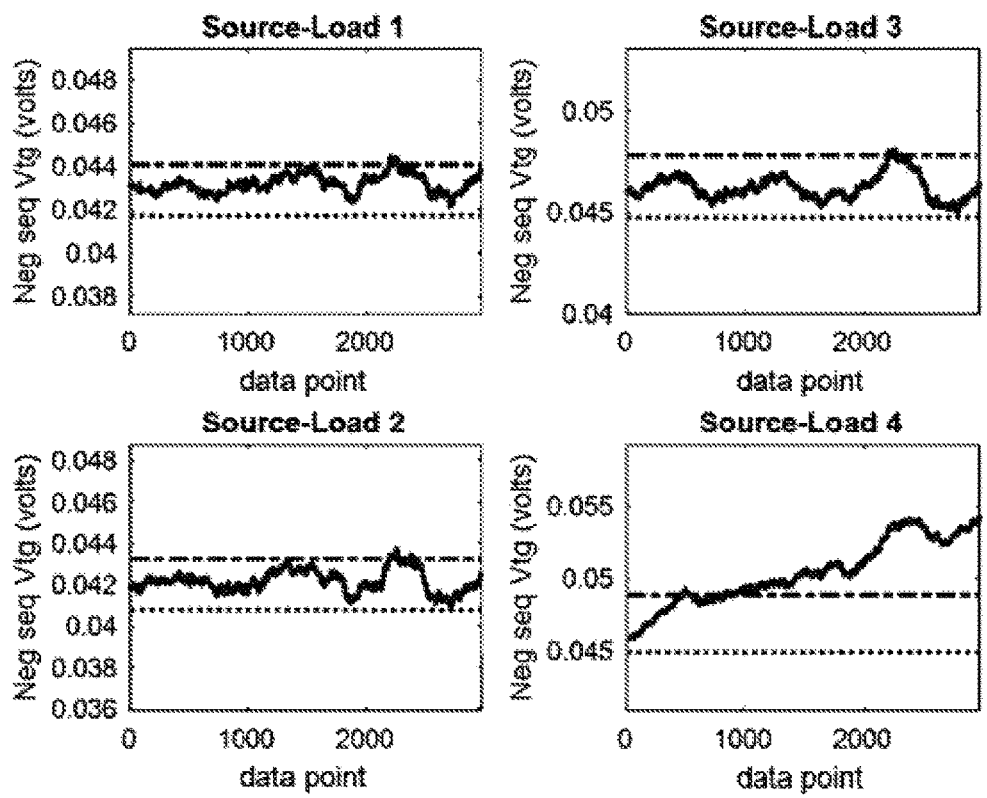
FIGS. 10A and 10B illustrate simulated negative sequence voltage difference variations for source/load combinations of the electrical assembly of FIG. 7 and corresponding fault status for connections of the electrical assembly of FIG. 7, respectively, for a second connection fault.
Figure 10B:
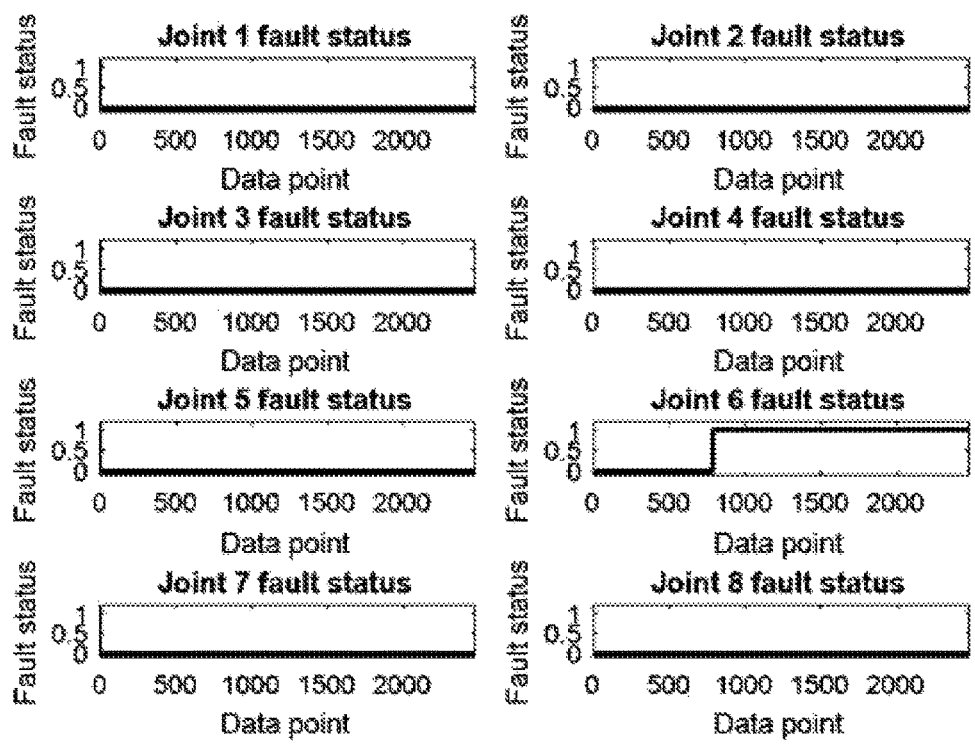
Figure 11A:
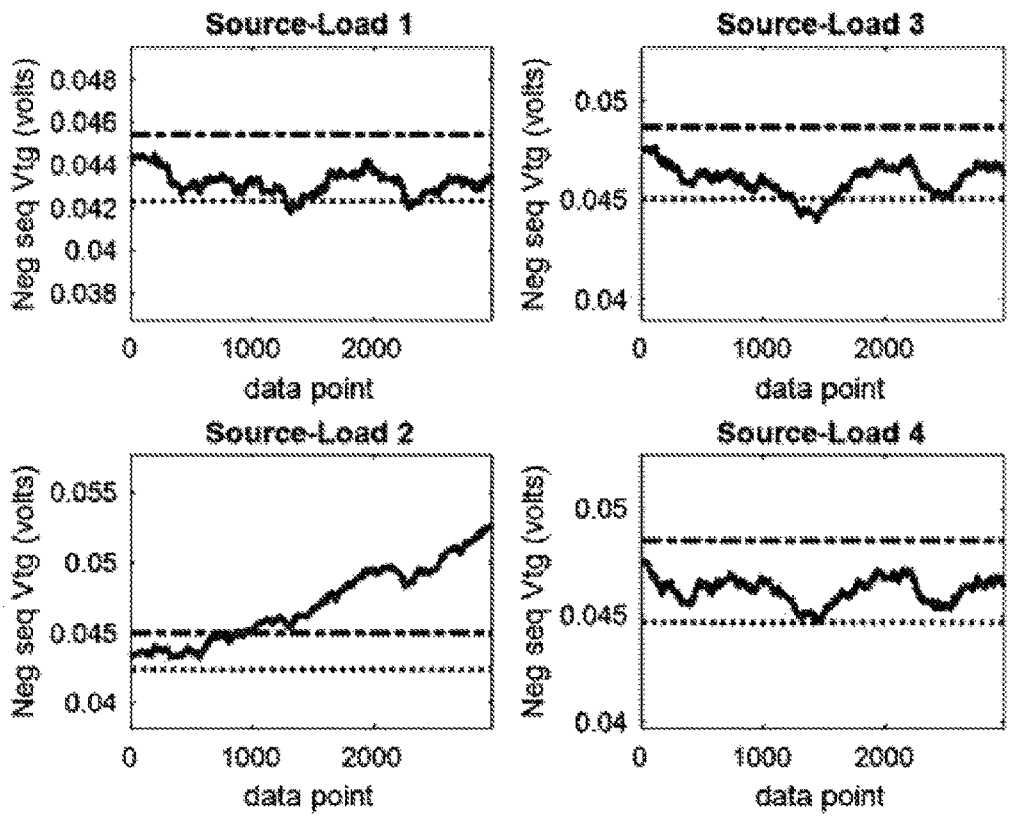
FIGS. 11A and 11B illustrate simulated negative sequence voltage difference variations for source/load combinations of the electrical assembly of FIG. 7 and corresponding fault status for connections of the electrical assembly of FIG. 7, respectively, for a third connection fault.
Figure 11B:
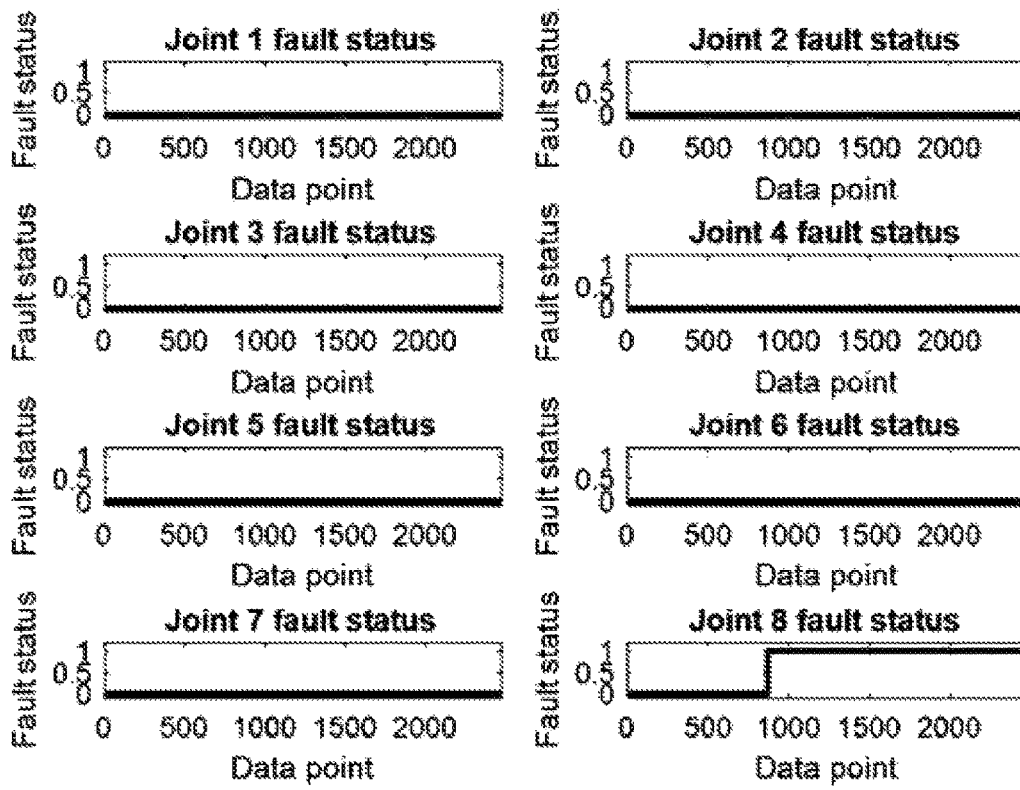

FIGS. 9A-B, 10A-B and 11A-B illustrate various simulated monitoring cases for the assembly of FIG. 7. In particular, FIG. 9A illustrates excursions of negative sequence voltage difference values out of detection ranges for source/load pairs (S1, L1), (S1, L2), (S1, L3) and (S1, L4), indicating a loose joint 1 as shown in FIG. 9B. FIG. 10A shows an excursion of negative sequence voltage difference values out of a detection range for a single source/load pair (S1, L4), indicating a loose joint 6 as shown in FIG. 10B. Finally, FIG. 11A shows an excursion of negative sequence voltage difference values of a detection range for a single source/load pair (S1, L2), indicating a loose joint 8 as shown in FIG. 11B.

It may be appreciated that negative sequence voltage difference monitoring as described above may identify more than one connection as potentially loose. If, for example, a monitoring process along the lines described above with reference to FIG. 6 results in detection of negative sequence voltage difference values outside of the predefined range for load/source pair (S1, L3) and (S1, L4), then joints 2 and 4 may be identified as potentially loose connections that require further investigation. In some embodiments, further discrimination among connections may be achieved by using voltage measurements at additional locations. For example, referring again to FIG. 8, for the above-described situation in which load/source pairs (S1, L3) and (S1, L4) are determined to have negative sequence voltage difference values falling outside of their respective detection ranges, further discrimination between potentially failed joints 2 and 4 could be provided by using a voltage sensor placed between joints 2 and 4, which would sense a voltage for an aggregate load L5 comprising components downstream of joint 2. In particular, if the load/source pair (S1, L5) also has a negative sequence voltage difference value falling outside of a predetermined detection range, this would indicate that only joint 2 is potentially loose.

Techniques described above may involve continuous monitoring that involves generation and processing of a very large number of data points. This can present a challenge in terms of storage requirements. Overall storage requirements generally depend on parameters such as the number of defined loads in a given assembly being monitored, the sampling interval and trend durations.

Figure 12:
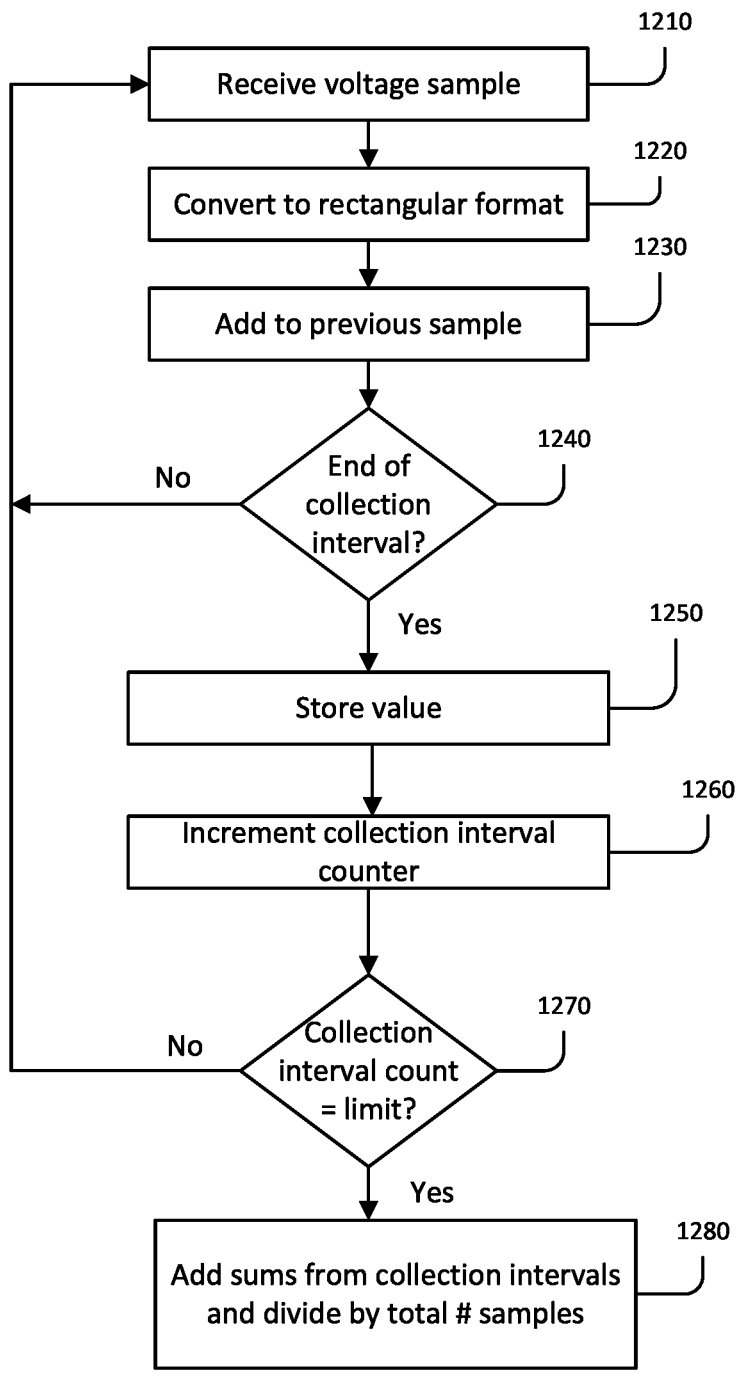
FIG. 12 is a flowchart illustrating operations for data storage reduction in a connection fault detection system according to further embodiments.

FIG. 12 is a flowchart illustrating a technique for reducing data storage of voltage values without undue loss of accuracy. Phasor (i.e., magnitude and phase) voltage data is generated for a given load/source pair (block 1210). The phasor data is converted to rectangular format (block 1220). Similarly converted rectangular format voltage data from subsequent samples is added (block 1230). Once data for a certain interval (e.g., 1 minute) has been collected, converted and summed, the summed value is stored (blocks 1240, 1250). Similar sums are then generated in the same fashion for subsequent collection intervals, with a counter being incremented for as each collection interval is processed (block 1260). Once all the collection intervals have been processed, the sums for the collection intervals are themselves summed and divided by the total number of samples collected over all of the collection intervals (blocks 1270, 1280), yielding an average voltage value for the collection intervals. Negative sequence voltage values may then be generated from this value and used to generate negative sequence voltage difference values in a loose connection detection process as outline above. Use of such a procedure in the operations described above with reference to FIGS. 4-6 can dramatically reduce memory requirements.

Figure 13:
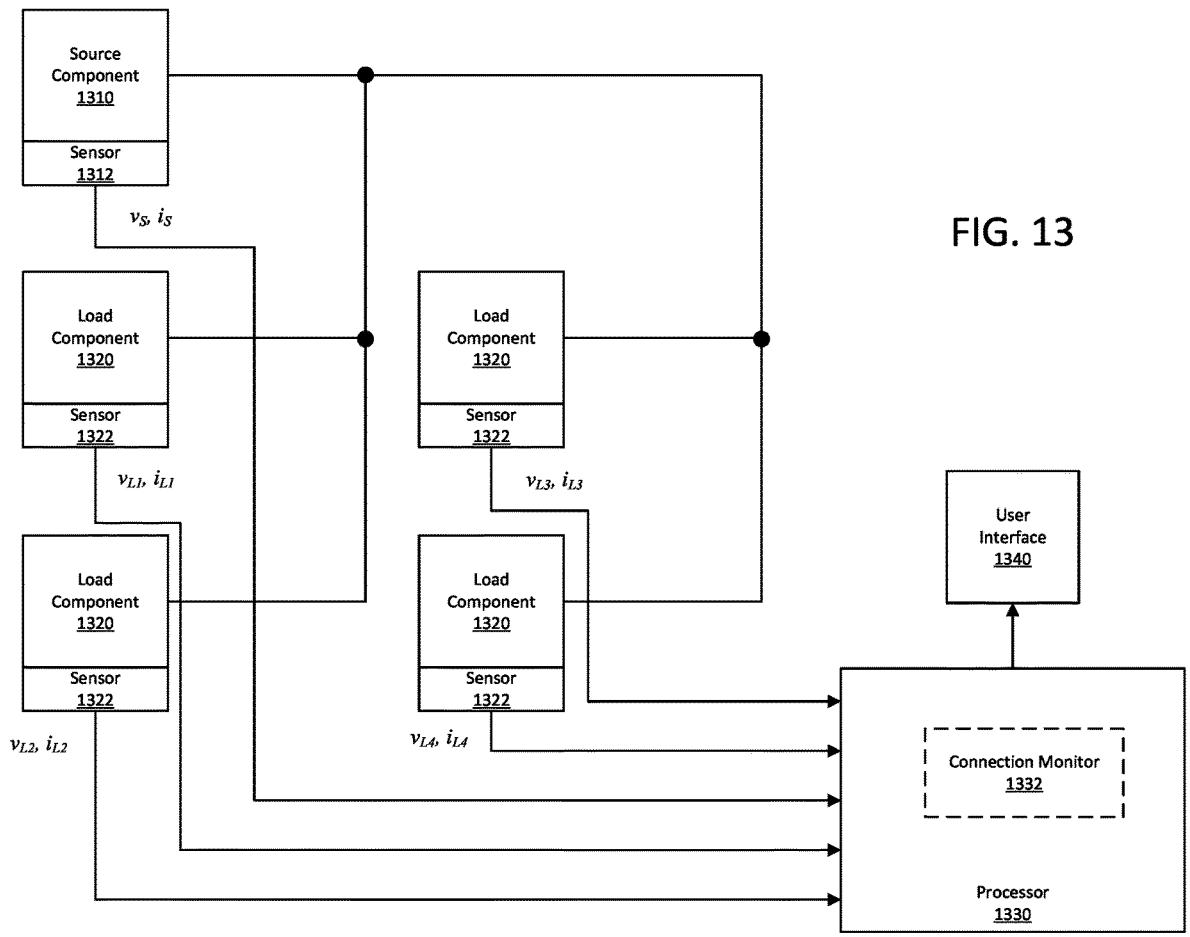
FIG. 13 is a block diagram illustrating a connection monitoring system according to further embodiments.

FIG. 13 illustrates a system for monitoring connection integrity according to further embodiments. A source component 1310 (e.g., a power distribution unit for a motor control center) is coupled to a plurality of load components 1320 by an electrical network. Sensors 1312, 1322 are configured to generate voltage information vs and current information $i_s$ associated with the source component 1310 and voltage information vu and current information $i_{Li}$ with the load components 1320. The sensors 1312, 1322 may be standalone and/or integrated with the source component 1310 and the load components 1320. The sensors 1312, 1322 may be solely purposed for the voltage and current sampling and processing operations for connection monitoring described herein and/or may be sensors that are also used for other purposes, such as for control of the components 1310, 1320 apart from the connection monitoring described herein.

The voltage and current information is provided to a monitor circuit, here shown as including a connection monitor application 1332 executing on a processor circuit 1330, which may comprise, for example, a microcontroller or similar data processing device along with associated memory and peripheral circuitry. It will be appreciated that the processor circuit 1330 may include a standalone device and/or may include portions integrated in one or more of the components 1310, 1320. The connection monitor application 1332 may be configured to perform loose connection identification operations along the lines discussed above with reference to FIGS. 4-11. The processor circuit 1330 may also be coupled to a user interface (e.g., a display, maintenance application, etc.) and the connection monitor application 1332 may be configured to communicate information relating to status of connections in the electrical network coupling the source component 1310 and the load components 1320 to a user, such as a maintenance person and/or an automated maintenance system.

As explained above, conventional techniques for loose connection detection often use temperature sensors to measure temperatures at predefined locations to detect a hotspot and issue a warning or alarm to the user. While this can provide an effective technique for detection, it typically requires a dedicated sensor at each location with a data transmission infrastructure to collect the measured temperatures. Additional concerns include the ability to fit dedicated sensors in locations that may be constrained by considerations of space and dielectric integrity. This can result in relatively high costs for the sensors and associated hardware.

Embodiments of the inventive concept can eliminate the need for dedicated temperature sensors with their associated cost. Because some embodiments use voltage measurements, mechanical time delays associated with temperature-based monitoring techniques can be avoided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of monitoring an electrical network coupling a source to a plurality of loads, the method comprising:
   collecting voltage samples for the source and the loads;
   generating respective negative sequence voltage difference values for respective source/load pairs from the voltage samples;
   identifying a connection in the electrical network based on the generated negative sequence voltage difference values of the source/load pairs against one or more fault criteria, wherein a connection fault is identified when at least one negative sequence voltage difference value deviates from expected operational characteristics for the respective source/load pair; and
   reporting the identified connection to a user.

2. The method of claim 1, wherein identifying a connection in the electrical network based on the generated negative sequence voltage difference values comprises:
   identifying at least one source/load pair having an associated negative sequence voltage difference value that meets a predetermined criterion; and
   identifying the connection based on the identified at least one source/load pair.

3. The method of claim 2, wherein identifying the connection comprises identifying at least one source/load pair having an associated negative sequence voltage difference value with a magnitude falling outside of at least one range associated with the at least one source/load pair.

4. The method of claim 3, wherein generating respective negative sequence voltage difference values is preceded by determining respective ranges for negative sequence voltage difference values for the respective source/load pairs.

5. The method of claim 1, wherein generating respective negative sequence voltage difference values for respective source/load pairs from the voltage samples comprises:
   generating respective negative sequence voltage values for the source and the loads from the voltage samples; and
   generating the respective negative sequence voltage difference values for the respective source/load pairs from the negative sequence voltage values.

6. The method of claim 5, wherein generating the respective negative sequence voltage difference values for the respective source/load pairs from the negative sequence voltage values comprises:
   normalizing the negative sequence voltage values; and
   generating the respective negative sequence voltage difference values for the respective source/load pairs from the normalized negative sequence voltage values.

7. The method of claim 5, wherein generating respective negative sequence voltage values for the source and the loads from the voltage samples comprises:
   averaging the voltage samples to generate average voltage values; and
   generating the respective negative sequence voltage values for the source and the loads from the average voltage values.

8. The method of claim 7, wherein averaging the voltage samples to generate average voltage values comprises:
   converting the voltage samples to rectangular coordinate voltage values;
   summing the rectangular coordinate voltage values to generate respective sums for respective collection intervals; and
   dividing a sum of the sums by a number of sampling intervals in the collection intervals to generate an average voltage value.

9. A system for monitoring an electrical network coupling a source to a plurality of loads, the system comprising:
   respective voltage sensing circuits configured to collect voltage samples for respective ones of the source and the loads; and
   a monitor circuit configured to:
      receive the voltage samples,
      generate average voltage values from the voltage samples,
      generate respective negative sequence voltage values for the source and the loads from the average voltage values,
      generate respective negative sequence voltage difference values for respective source/load pairs from the negative sequence voltage values,
      identify a connection in the electrical network based on the negative sequence voltage difference values, and
      report the identified connection to a user.

10. The system of claim 9, wherein the monitor circuit is configured to identify at least one source/load pair having an associated negative sequence voltage difference value that meets a predetermined criterion and to identify the connection based on the identified at least one source/load pair.

11. The system of claim 10, wherein the monitor circuit is configured to identify at least one source/load pair having an associated negative sequence voltage difference value with a magnitude falling outside of at least one range associated with the at least one source/load pair.

12. The system of claim 11, wherein the monitor circuit is configured to determine respective ranges for negative sequence voltage difference values for the respective source/load pairs.

13. The system of claim 12, wherein the monitor circuit is configured to generate respective negative sequence voltage difference values from voltage samples for a calibration interval and to determine respective ones of the ranges for the negative sequence voltage difference values for the calibration interval.

14. The system of claim 9, wherein the monitor circuit is configured to normalize the negative sequence voltage values and to generate the respective negative sequence voltage difference values for the respective source/load pairs from the normalized negative sequence voltage values.

15. The system of claim 9, wherein the monitor circuit is configured to convert the voltage samples to rectangular coordinate voltage values, to sum the rectangular coordinate values to generate respective sums for respective collection intervals, and to divide a sum of the sums by a number of sampling intervals in the collection intervals to generate an average voltage value.

16. The system of claim 9, wherein the monitor circuit comprises a processor circuit configured to execute a connection monitor application configured to generate the respective negative sequence voltage difference values for the respective source/load pairs from the voltage samples, to identify the connection in the electrical network based on the generated negative sequence voltage difference values, and to report the identified connection to the user.

17. A method of monitoring an electrical network coupling a source to a plurality of loads, the method comprising:
collecting voltage samples for the source and the loads;
generating negative sequence voltage values for the source and the loads from the voltage samples;
normalizing the negative sequence voltage values;
generating respective negative sequence voltage difference values for respective source/load pairs from the normalized negative sequence voltage values;
identifying a connection in the electrical network based on the generated negative sequence voltage difference values; and
reporting the identified connection to a user.

* * * * *